(12) United States Patent
Hatani et al.

(10) Patent No.: US 6,683,335 B2
(45) Date of Patent: Jan. 27, 2004

(54) GATE ARRAY LAYOUT FOR INTERCONNECT

(75) Inventors: Naohisa Hatani, Kuze-gun (JP); Manabu Ohkubo, Otsu (JP)

(73) Assignee: International Business Machines Corporation, Armonk, NY (US)

( * ) Notice: Subject to any disclaimer, the term of this patent is extended or adjusted under 35 U.S.C. 154(b) by 40 days.

(21) Appl. No.: 09/887,821

(22) Filed: Jun. 22, 2001

(65) Prior Publication Data

US 2002/0020857 A1 Feb. 21, 2002

(30) Foreign Application Priority Data

Jun. 22, 2000 (JP) .......................................... 2000-187459

(51) Int. Cl.[7] .............................................. H01L 27/10
(52) U.S. Cl. ....................................... 257/206; 257/208
(58) Field of Search .................................... 257/206, 208

(56) References Cited

U.S. PATENT DOCUMENTS

| | | | | |
|---|---|---|---|---|
| 5,136,356 A | * | 8/1992 | Sakuda et al. ............... 257/211 |
| 5,289,021 A | * | 2/1994 | El Gamal .................... 257/206 |
| 5,420,447 A | * | 5/1995 | Waggoner .................... 257/206 |
| 6,177,709 B1 | * | 1/2001 | Iranmanesh .................. 257/390 |
| 6,194,914 B1 | * | 2/2001 | Sako .......................... 326/113 |
| 6,204,542 B1 | * | 3/2001 | Kinoshita et al. ........... 257/401 |
| 6,445,049 B1 | * | 9/2002 | Iranmanesh .................. 257/401 |

FOREIGN PATENT DOCUMENTS

| | | | | |
|---|---|---|---|---|
| EP | 523967 A2 | * | 1/1993 | ......... H01L/27/118 |
| JP | 05136356 A | * | 6/1993 | ......... H01L/27/092 |

* cited by examiner

*Primary Examiner*—Eddie Lee
*Assistant Examiner*—Paul E Brock, II
(74) *Attorney, Agent, or Firm*—Jay H. Anderson

(57) ABSTRACT

In a gate array having adjacent lines of PFETs and NFETs along a first axis, some gates of PFETs and/or NFETs extend into the region between wells and along a first (x) axis of the lines of transistors to overlap along the axis, so that an extended gate of an nth transistor, a gate of an (n−1)th non-extended transistor and a gate of an (n−1)th non-extended transistor of the opposite polarity lie along an axis (y) perpendicular to the first axis. In a rectangular layout, the upper right transistor (having an extended gate) is connected to the lower left transistor by a short connection along the y axis.

3 Claims, 10 Drawing Sheets

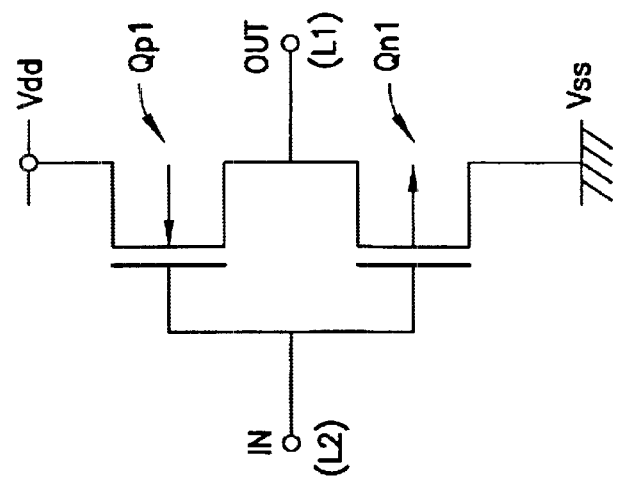
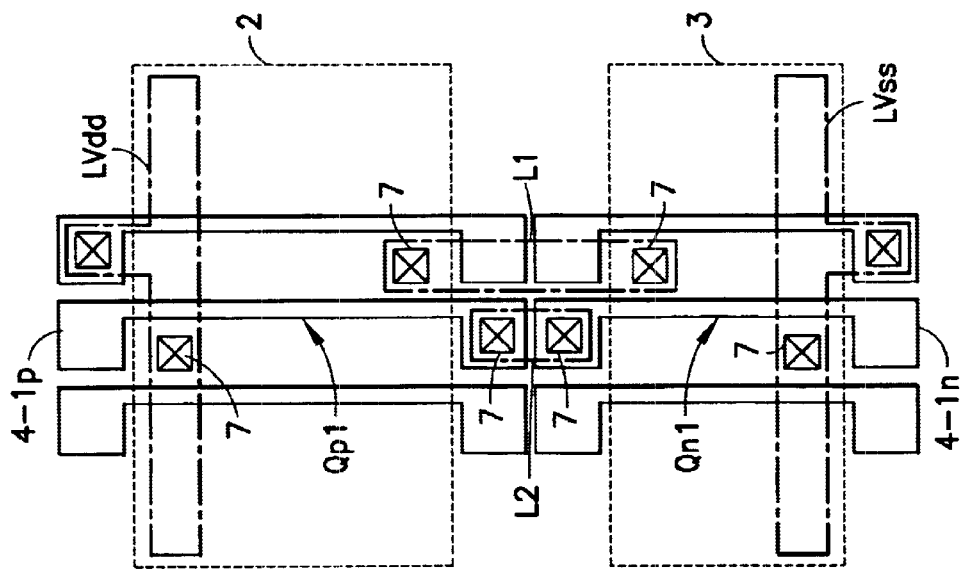
FIG.2b PRIOR ART
FIG.2a PRIOR ART

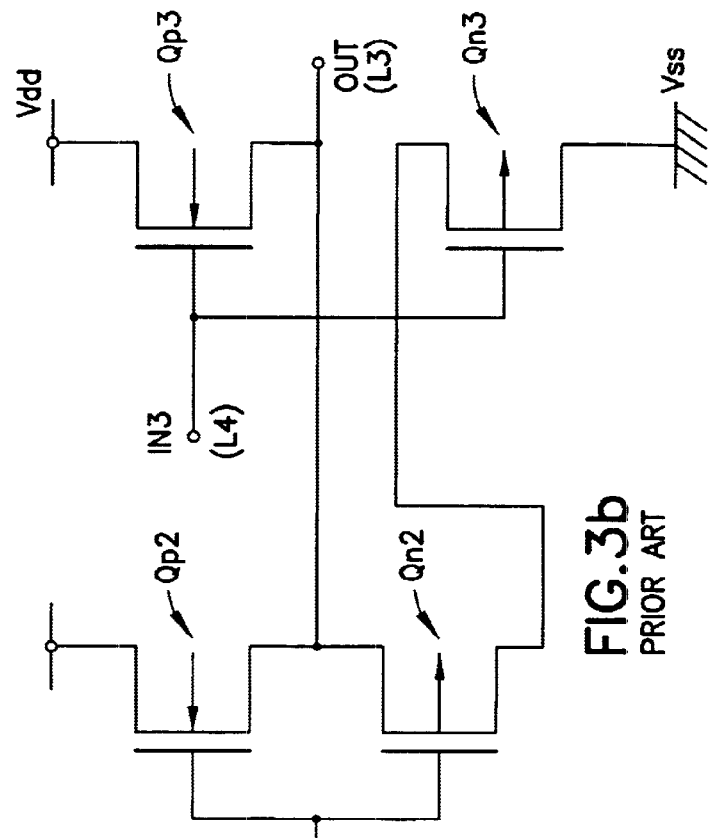
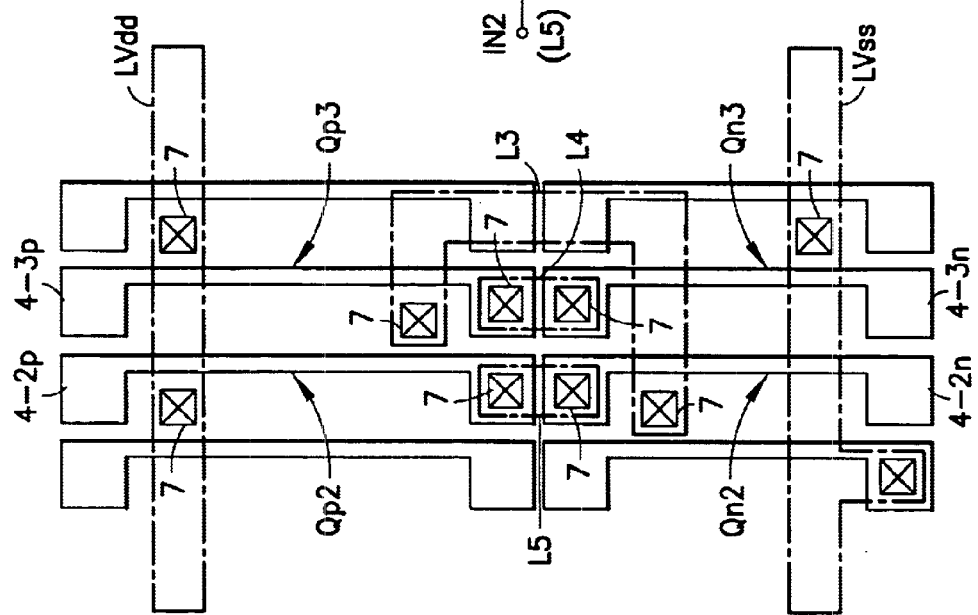
FIG. 3b PRIOR ART
FIG. 3a PRIOR ART

GATE ARRAY LAYOUT FOR INTERCONNECT

FIELD OF THE INVENTION

The present invention relates to a semiconductor integrated circuit, and in particular to an effective technique that is used for a gate array employed for high integration and low power.

BACKGROUND OF THE INVENTION

To appropriately support the production of a variety of small lots of ASIC (Application Specific Integrated Circuit) chips, elements such as transistors are manufactured in advance for use as base cells. Later, in addition to first layer lines provided for such cells, lines for a customized circuit, designed in accordance with customer specifications, are provided to produce ASICs that can perform functions required for particular applications. This production method thus provides means for flexibly coping with the needs of clients, and contributes to a reduction in the time required for the delivery of orders. In one type of ASIC, a gate array, p-type transistors and n-type transistors are arranged in separate arrays as basic cells. Then, when customized circuit lines for the transistors (basic cells) are added, a logic circuit that satisfies the needs of a customer can be provided. It should be noted that the transistors used for this purpose are MISFETs (Metal Insulator Semiconductor Field Effect Transistors).

FIG. 1 is a plan view of an example conventional gate array. An n well 2 and a p well 3 are formed on the main face of a semiconductor substrate 1. Gate lines 4 are formed across the n well 2 and the p well 3. Each of the gate lines 4 includes a gate electrode 4a, which functions as the gate of a MISFET, and a contact (connection region) 4b for the upper layer line. The contact 4b is formed on an element separation region 5, and a contact member for effecting a connection with the first layer line is deposited thereon. Doped regions 6, which are formed above the n well 2 on either side of gate electrodes 4a, are p-type regions, and function as the sources or the drains for p-type MISFETs. The doped regions 6, which are formed above the p well 3, are n-type regions and function as the sources or the drains of n-type MISFETs. A gate line 4, an impurity region 6 and a channel region below a gate electrode 4a constitute one MISFET.

Multiple p-type MISFETs and multiple n-type MISFETs are arranged in like arrays along the respective well regions (the n well 2 and the p well 3) in the x direction (first direction) in which the well regions are formed and extended. Adjacent MISFETs (p-type MISFETs or n-type MISFETs) share the impurity regions 6 that serve as the sources or drains. The arrays of p-type MISFETs and n-type MISFETs are located adjacent to each other in the y direction (second direction), and since the p-type and the n-type MISFETs are arranged adjacently, wiring of a CMOS circuit is facilitated.

To use this gate array to constitute an inverter, for example, only the following connections need be made. FIG. 2A is a plan view of an example inverter using the conventional gate array, and FIG. 2B is a circuit diagram for the inverter.

In FIGS. 2A and 2B, a MISFET (Qp1) that includes a gate line 4-1p and a MISFET (Qn1) that includes a gate line 4-1n are employed. In the following explanation, a p-type MISFET that includes a gate line 4-kp is denoted by Qpk (k is a natural number), and an n-type MISFET that includes a gate line 4-kn is denoted by Qnk. One of the impurity regions 6 (to the left of the gate line 4-1p) of the Qp1 and a line LVdd are connected by a contact 7, and one of the impurity regions 6 (to the left of the gate line 4-1n) of the Qn1 and a line LVss are connected by a contact 7. The other impurity region 6 (to the right of the gate line 4-1p) of the Qp1 and the other impurity region 6 (to the right of the gate line 4-1n) of the Qn1 are connected via a line L1 and contacts 7. The gate line 4-1p of the Qp1 and the gate line 4-1n of the Qn1 are connected via contacts 7 and a line L2 formed on respective contacts 4b. The line L2 corresponds to the input IN of the inverter, and the line L1 corresponds to the output OUT of the inverter.

Further, to use the gate array to constitute a NAND circuit, for example, only the following connections need be made. FIG. 3A is a plan view of an example NAND circuit using the conventional gate array, and FIG. 3B is a circuit diagram showing the NAND circuit. It should be noted that the well regions are not shown in the plan views following FIG. 3 for the simplification of the drawings.

The NAND circuit comprises an MISFET (Qp2) that includes a gate line 4-2p, an MISFET (Qp3) that includes a gate line 4-3p, an MISFET (Qn2) that includes a gate line 4-2n, and an MISFET (Qn3) that includes a gate line 4-3n. One impurity region 6 of the Qp2 and one impurity region 6 of the Qp3 are connected to a line LVdd via contacts 7 and one impurity region 6 of the Qn3 is connected to a line LVss via a contact 7. The impurity region 6 shared by the Qp2 and the Qp3 and the impurity region 6 of the Qn2 are connected via a line L3 and contacts 7. The gate line 4-2p of the Qp2 and the gate line 4-2n of the Qn2 are connected via a line L4 in the same manner as described above, and the gate line 4-3p of the Qp3 and the gate line 4-3n of the Qn3 are connected via a line L5. The line L5 corresponds to the input IN2 of the NAND circuit, the line L4 corresponds to the input IN3 of the NAND circuit, and the line L3 corresponds to the output OUT of the NAND circuit.

The first layer lines (LVdd, LVss and L1 to L5) are formed on an interlayer insulating film (not shown) that covers the gate lines, and generally are composed of a metal such as tungsten, or of polysilicon. The contacts 7 are conductive members provided inside connection holes that are formed in the interlayer insulating film. The contacts 7 are made of the same material as the first layer lines, or are separately provided as a plug from the first layer line.

When arbitrary lines are employed for the gate array as has previously been described, logic circuits can be produced. For an inverter or a NAND circuit, the gate lines of p-type MISFETs and n-type MISFETs can be interconnected by using the shortest possible lines (L2, L4 and L5) to connect adjacent, vertically arranged (in the y direction) MISFETs.

However, for a latch circuit in FIGS. 4A and 4B, the gate lines of a diagonally arranged p-type and n-type MISFET must be connected. FIG. 4A is a plan view of a latch circuit using the conventional gate array, and FIG. 4B is a circuit diagram of the latch circuit.

When two MISFETs having the input IN4 terminal of the latch circuit as a gate input terminal are defined as Qp4 and Qn4, the gate line 4-4p of the Qp4 and the gate line 4-4n of the Qn4 are connected by the shortest line (line L6), as is shown in FIG. 4B. Since it is rational that MISFETs adjacent to Qp4 and Qn4 should be selected as those connected in series to Qp4 and Qn4, Qp5 and Qn5 are selected.

However, the gate line 4-5p of Qp5 should not be connected to the gate line of Qn5, but must be connected to the gate line of another n-type MISFET (Qn7 in FIG. 4A). Further, the gate line 4-5n of Qn5 must be connected to the gate line of a p-type MISFET (Qp6 in FIG. 4A) other than Qp5. Therefore, as is shown in FIG. 5, when the gate line 4-5n and the gate line 4-6p are connected by using the line L7 which travels the shortest distance, the gate lines 4-5p and 4-7n have to be connected by detouring around line L8. It should be noted that FIG. 5 is a plan view of a portion extracted from FIG. 4A.

When the lines intersect for the interconnection of the gate lines of a p-type MISFET and an n-type MISFET, as described above, a line for detouring around a line (first layer line) for connecting gate lines must be found, so that devices located in dotted regions (4-6n and 4-7p) in FIG. 5 can not be employed. Further, since the area occupied by the first layer line is increased, there are devices that can not be employed due to the line layout.

Whereas, an increased demand has arisen for reductions in the costs of ASICs, a reduction in chip size is required in order to eliminate as many useless devices as possible. This is especially true since many latch circuits are employed for a chip, and useless devices should be eliminated as soon as possible.

It is, therefore, one object of the present invention to provide a layout for facilitating the interconnection of gate lines of devices (MISFETs) in gate arrays that are diagonally positioned.

It is another object of the present invention to increase gate array wiring efficiency and to reduce the number of devices required to implement the same function, so that reductions in manufacturing costs can be accelerated.

SUMMARY OF THE INVENTION

An overview of the present invention will now be given. One part (a connection region) of the gate lines of adjacent MISFETs is extended and formed between a p-type MISFET and an n-type MISFET that constitute a gate array. That is, the connection regions are so formed that vertically (in the y direction: second direction) the connection region (extended contact region) of an n-type MISFET, the connection region of an adjacent MISFET and the connection region of a p-type MISFET appear in the named order (and all have the same location along the first direction). In other words, at least some of the gates of a set of p-type transistors (or of a set of n-type transistors) constitute an extended-contact subset of the set of contacts and extend along the first direction such that they overlap an adjacent transistor gate (of the same set, - or p-) along the first direction; i.e. one of the extended contacts is located at the same location along the first direction as an adjacent contact.

Specifically, the present invention has the following configuration. A semiconductor integrated circuit according to the present invention comprises: a semiconductor substrate (1); an n-type region (2) on the semiconductor substrate; a p-type region (3) on the semiconductor substrate; an element separation region (5) between the n-type region and the p-type region; p-type transistors (transistors including 4-20 and 21p, Qp30 to Qp37 and Qp40 to Qp47) that are arranged on the n-type region adjacently in a first direction (x); n-type transistors (transistors including 4-20 and 21n, Qn30 to Qn37 and Qn40 to Qn47) that are adjacently arranged on the p-type region in the first direction (x); and a connection region (10) that is formed on the element separation region (5) and that constitutes one part of control lines (4-20p, 4-21p, 4-20n, 4-21n, 4-30p to 37p, 4-30n to 37n, 4-40p to 47p and 4-40n to 47n) of the p-type or the n-type transistors, wherein the connection region (10) includes a portion that is extended between second transistors (transistors including 4-20p, Qq32 and Qp42), which are arranged in the first direction (x) adjacent to first transistors (transistors including 4-21p, Qp33 and Qp43) that include the connection region (10) as one part of the control lines, and third transistors (transistors that include 4-20n, Qn32 and Qn42), which are arranged adjacent to the second transistors in a second direction (y) perpendicular to the first direction.

For convenience, the following description of the symbols is collected in one place.

| | |
|---|---|
| 1: | Semiconductor substrate |
| 2: | n well |
| 3: | p well |
| 4: | 4-kp, 4-kn (k = natural number): Gate line |
| 4a: | Gate electrode |
| 4b: | Contact |
| 5: | Element separation region |
| 6: | Doped region |
| 7: | Contact |
| 10: | Connection region |
| IN (IN 2 to IN 4): | Input |
| L1 to L18: | Line |
| LVdd: | Power line |
| LVss: | Ground line |
| OUT: | Output |
| Qnk (k = natural number): | n-type MISFET |
| Qpk (k = natural number): | p-type MISFET |

For the semiconductor integrated circuit, control lines (4-21p, 4-33p and 4-43p) of the first transistors are connected to control lines (4-20n, 4-32n and 4-42n) of the third transistors by using first lines (L9 and L12), and control lines (4-20p, 4-32p and 4-42p) of the second transistors are connected to control lines (4-21n, 4-33n and 4-43n) of fourth transistors (transistors including 4-21n, Qn33 and Qn43), which are arranged adjacent to the first transistors in the second direction (y) and adjacent to the third transistors in the first direction (x), by using second lines (L10 and L13) that differ from the first lines.

The transistors constitute a gate array. A gate region (4a) on the transistors has a space wherein three lines (L9 to L18) that extend in the first direction (x) can be laid in the second direction (y).

When the connection region is thus formed, the degree of freedom for the design of the first layer lines connected to the gate lines can be increased, and diagonally located devices can be easily connected. Further, since first layer lines need not be detoured, the occurrence of useless devices can be limited, and area occupied by the arranged lines can be reduced.

BRIEF DESCRIPTION OF THE DRAWINGS

FIG. 2A is a plan view of a prior art inverter using the conventional gate array.

FIG. 2B is a circuit diagram showing an inverter.

FIG. 3A is a plan view of a prior art NAND circuit using the conventional gate array.

FIG. 3B is a circuit diagram showing the NAND circuit.

DESCRIPTION OF THE PREFERRED EMBODIMENT

Figure 1:
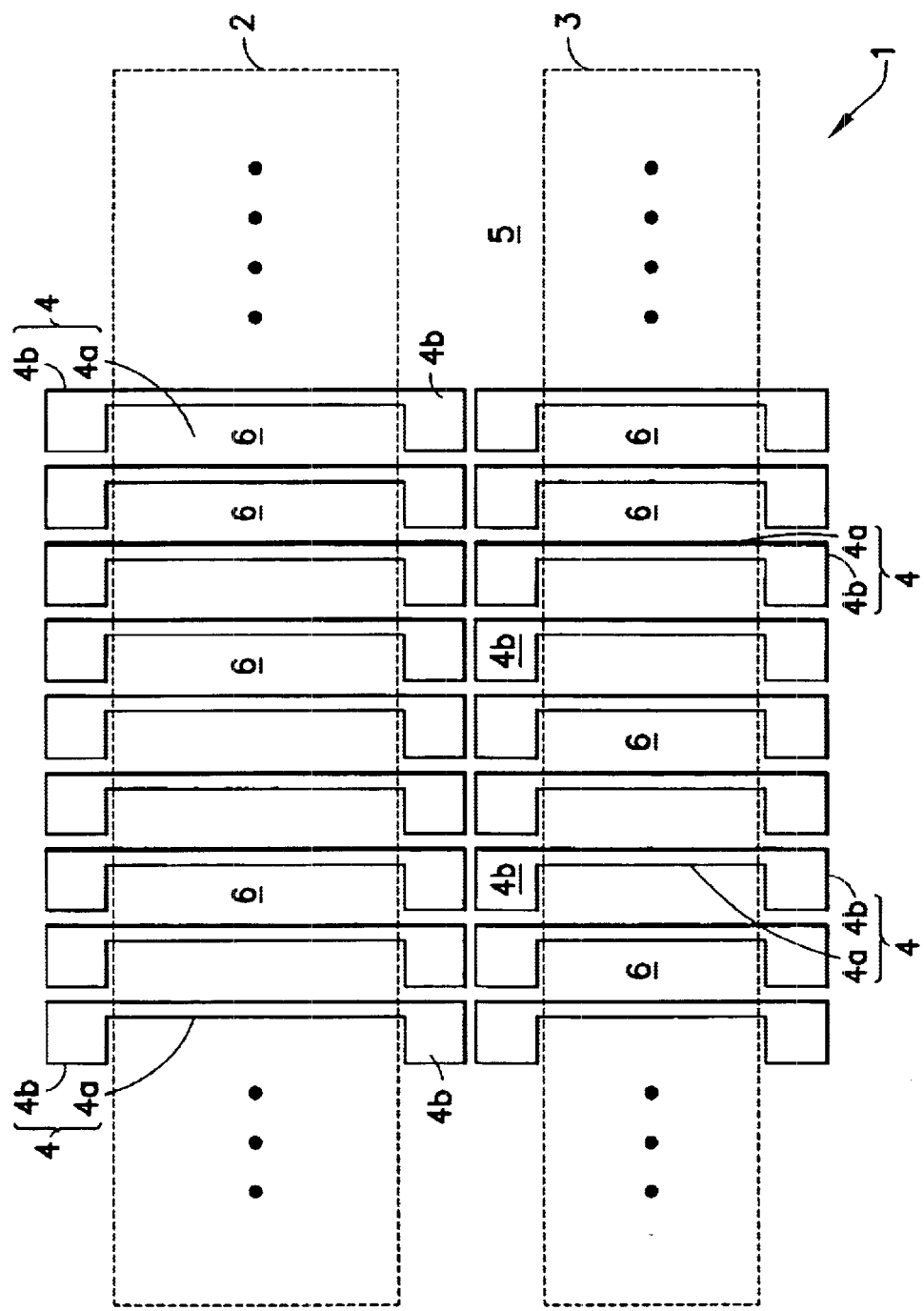
FIG. 1 is a plan view of a prior art conventional gate array.

The preferred embodiment of the present invention will now be described in detail while referring to the accompanying drawings. It should be noted, however, that the present invention can be variously modified and is not limited to this embodiment. The same reference numerals are used throughout the embodiment to denote corresponding or identical components.

Figure 6:
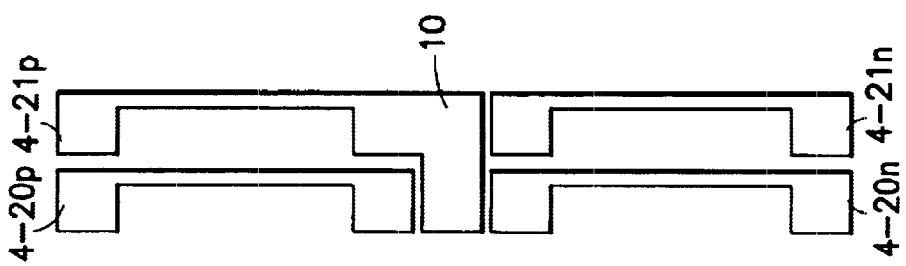
FIG. 6 is a plan view of one part extracted from a gate array according to one embodiment of the present invention.

FIG. 6 is a plan view of one portion extracted from a gate array according to one embodiment of the present invention. The gate array of this embodiment includes: gate lines (control lines) 4-20$p$ and 4-21$p$ that constitute a part of a p-type MISFET, and gate lines 4-20$n$ and 4-21$n$ that constitute a part of an n-type MISFET. One part of a connection region 10 of the gate line 4-21$p$ is extended between the gate lines 4-20$p$ and 4-20$n$, as is shown in FIG. 6. When the one part of the connection region (contact) 10 of the gate lines is formed between the MISFETs arranged adjacent in the x direction, the gate lines of the MISFETs adjacent in the y direction can be easily connected.

Figure 7:
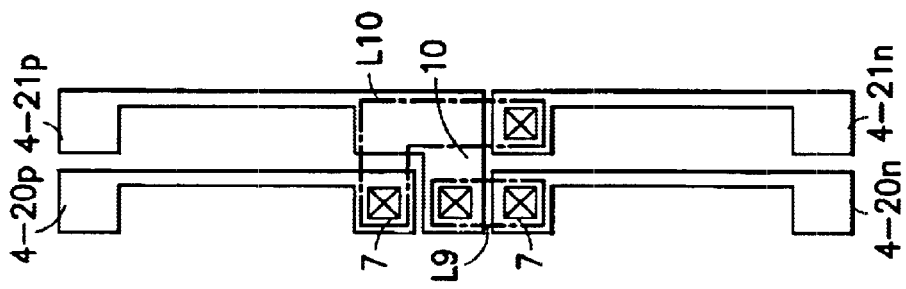
FIG. 7 is a plan view of an example of the line arrangement in FIG. 5 provided by using the gate array of this embodiment.
Figure 5:
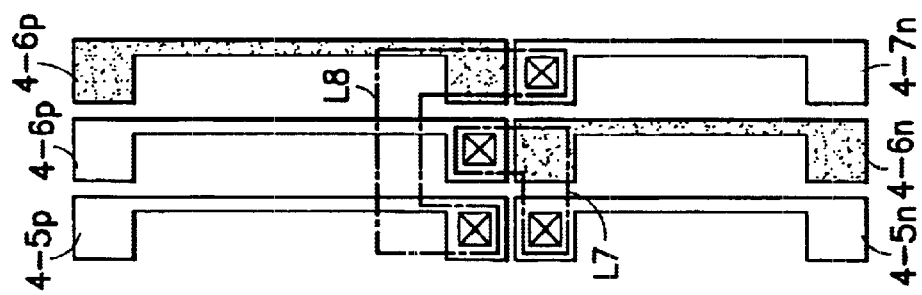
FIG. 5 is a plan view of one part extracted from the circuit in FIG. 4A.

FIG. 7 is a plan view of an example of the wiring in FIG. 5 that is provided by using the gate array of this embodiment. When in FIG. 5 a MISFET to be connected to the gate line is located at a diagonal location, a line L8 must be arranged so that it detours around a line L7. However, when the connection region 10 whereat the gate line 4-21$p$ is extended is employed, the gate lines 4-21$p$ and 4-20$n$, which are located diagonally to each other can be connected via contacts 7 by a line L9. The diagonally positioned gate lines 4-20$p$ and 4-21$n$ can also be connected by the shortest line L10. As is described above, when the gate array of this embodiment is employed, the diagonally located gate lines can be connected by the shortest line (the first layer line), and an unnecessary wiring region is not required. Thus, the MISFET that constitutes the gate array is not wasted, and while it is apparent from a comparison of FIGS. 5 and 7 that conventionally six basic cells are required, in this embodiment, only four basic cells are required to provide the same wiring.

Since in this embodiment the connection region 10 is formed, space equivalent to one wiring grid is required in the y direction. Therefore, either the device area must be expanded in the y direction a distance equivalent to one wiring grid, or the gate width of the p-type MISFET or the n-type MISFET must be reduced a like distance. However, when the ASIC for this embodiment is used for low power, the ON current requested for each MISFET is not very large, and a reduction in the gate width of a distance equivalent to one wiring grid can be permitted. If a large ON current is requested, however, multiple MISFETs must be connected in parallel only at the pertinent portion. Further, even though the device area must be expanded a distance equivalent to one wiring grid, large effects can be obtained due to a reduction in the area occupied in the x direction, and can offset or exceed the above shortcoming. According to the embodiment, three wiring grids are formed in the gate electrode region for each p-type and each n-type MISFET. As is explained later, if the space for about three wiring grids is ensured, the line between MISFETs is possible. Therefore, while four wiring grids are conventionally obtained for a p-type MISFET, as described above, the gate width can be reduced, and so long as space for three wiring grids is ensured, a logic circuit can be formed. Therefore, according to the embodiment, since the wiring area in the y direction is not increased and the wiring area in the x direction can be reduced, the total wiring area can be reduced, as can the number of cells that are uselessly employed, and the manufacturing costs of the ASIC can be reduced.

Figures 4A, 4B:
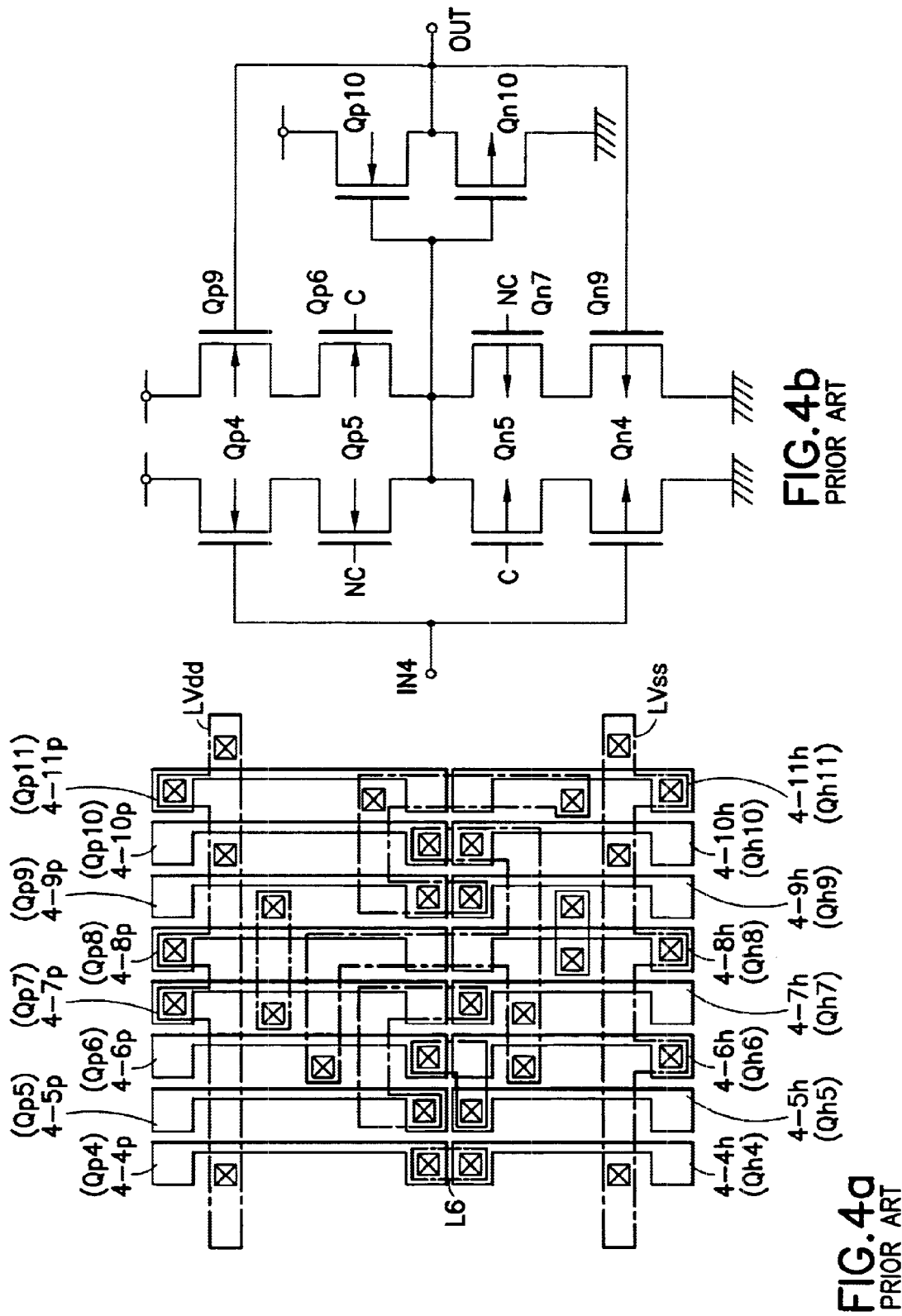
FIG. 4A is a plan view of a prior art latch circuit using the conventional gate array.
FIG. 4B is a circuit diagram showing the latch circuit.
Figure 8:
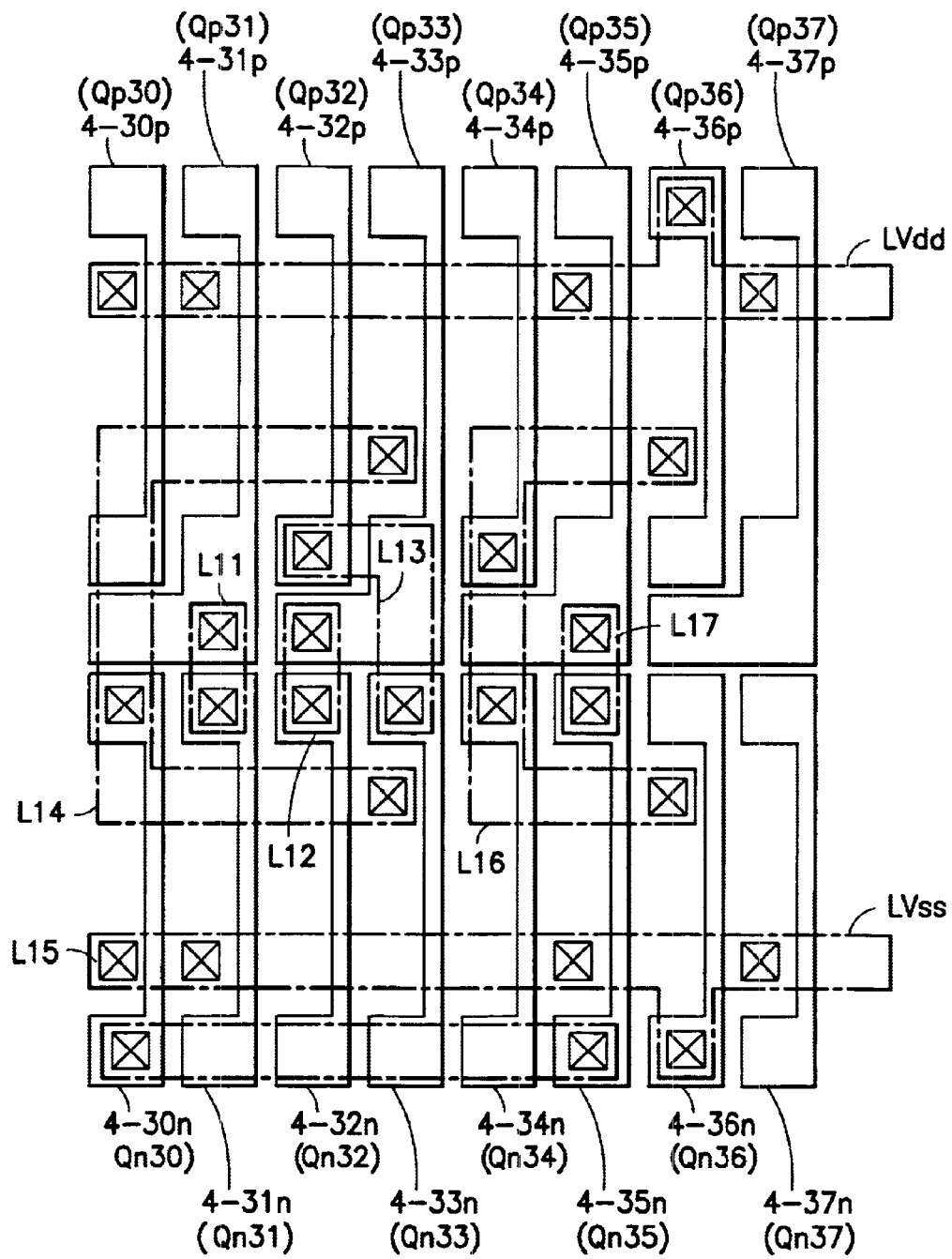
FIG. 8 is a plan view of an example of the latch circuit in FIG. 4B obtained by using the gate array of this embodiment.

FIG. 8 is a plan view of an example for the latch circuit in FIG. 4B using the gate array of this embodiment. A line L11 corresponds to the input IN4; Qp31 and Qn31 correspond to Qp4 and Qn4; Qp32 and Qn32 correspond to Qp5 and Qn5; and Qp33 and Qn33 correspond to Qp6 and Qn7. The connection region of the gate line 4-33$p$ and the line L12 are employed to connect the gate lines 4-33$p$ and 4-32$n$ that are located diagonally, and the line L13 is employed to connect the gate lines 4-32$p$ and 4-33$n$ that are diagonally located. Therefore, compared with the latch circuit in FIG. 4B, the wiring area in the x direction can be reduced by a size equivalent to one cell.

In addition, Qp34 and Qn34 correspond to Qp9 and Qn9, and Qp35 and Qn35 correspond to Qp10 and Qn10. The line L14 is used to connect the impurity region shared by Qp32 (corresponding to Qp5) and Qp33 (corresponding to Qp6) to the impurity region shared by Qn32 (corresponding to Qn5 and Qn33 (corresponding to Qn7). These impurity regions are connected to the gates of Qn35 (corresponding to Qn10) and Qp35 (corresponding to Qp10) via the gate line 4-30$n$ and the line L15. While the MISFETs in a size equivalent to the area wherein the line L14 is laid are wasted (note however, that since the gate line 4-30$n$ is used as a line, strictly speaking the MISFETs are not wasted), such use of the wiring area is allocated for the example in FIG. 4A (the gate lines 4-8$p$ and 4-8$n$), and does not constitute a shortcoming merely for this embodiment. The line L16 is connected to the impurity region of Qp35 and Qn35 and the gate line (4-34$p$ and 4-34$n$) of Qp34 and Qn34, and corresponds to the out OUT.

That is, according to the embodiment, the latch circuit in FIG. 4B can be wired in the area of fourteen cells. Compared with the prior art (FIG. 4A) that requires sixteen cells, the wiring area can be reduced by a size equivalent to two cells (one wiring grid in the x direction).

Figure 9:
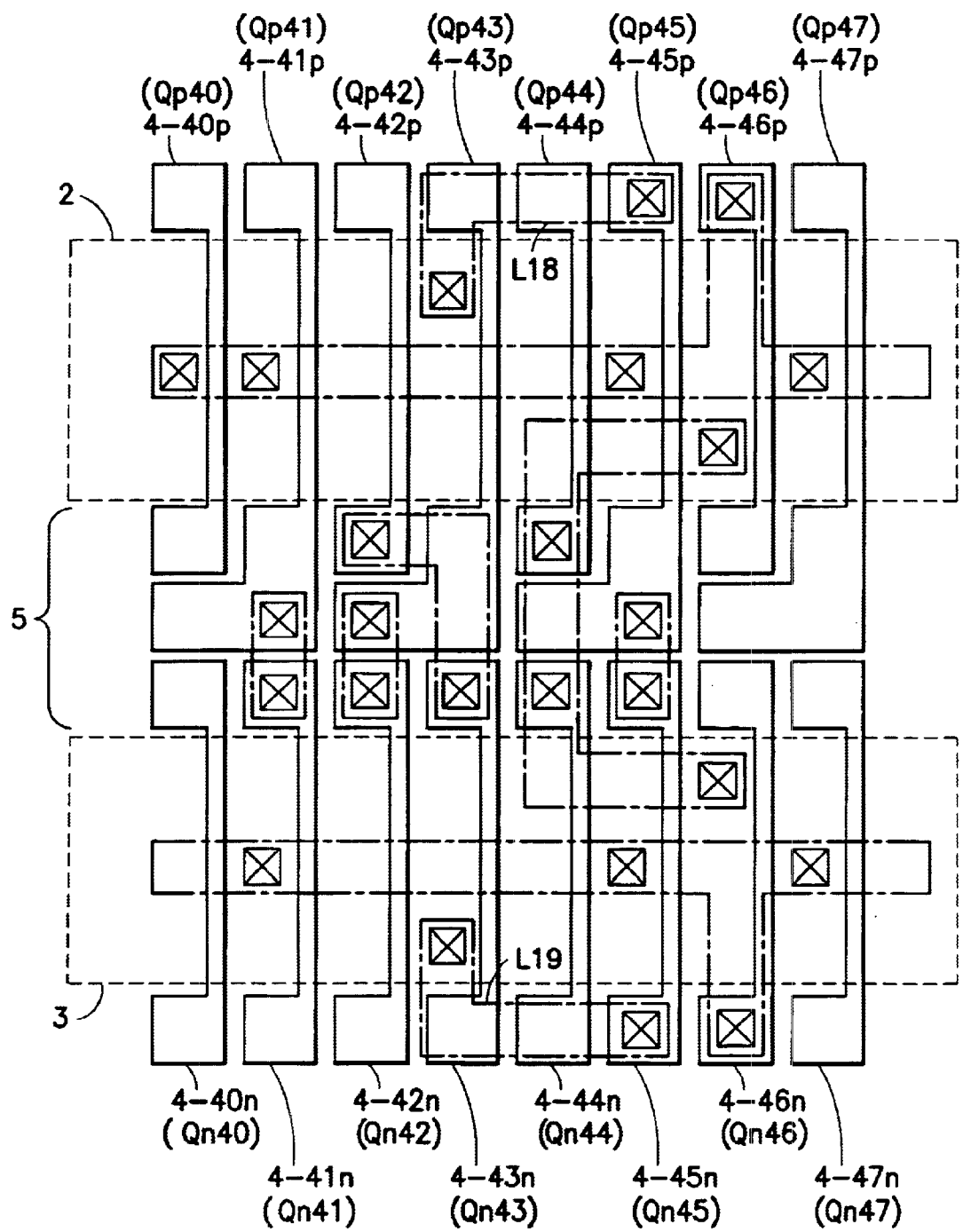
FIG. 9 is a plan view of another example of the latch circuit in FIG. 4B provided by using the gate array of this embodiment.

FIG. 9 is a plan view of another example for the latch circuit in FIG. 4B that uses the gate array of this embodiment. Qp41 to Qp45 and Qn41 to Qn45 in FIG. 9 are the same as Qp31 to Qp35 and Qn31 to Qn35 in FIG. 8. It should be noted, however, that in FIG. 9, the lines LVdd and LVss for the feeding of the power potential are moved toward the center one grid line, and instead of the line L14 in FIG. 8, the lines L18 and L19 are used to connect the impurity region shared by Qp42 and Qp43, the impurity region shared by Qn42 and Qn43, and the gates of Qn45 and Qp45. With this configuration, the wiring area required for the line L14 can be reduced, and compared with the line arrangement in FIG. 8, the wiring area in FIG. 9 can be reduced in the x direction the equivalent of one grid line. Compared with the prior art, the area can be reduced the equivalent of two grid lines, and only twelve MISFETs (twelve cells) are required to constitute the latch circuit in FIG. 4B.

The present invention has been specifically explained; however, the invention is not limited to this embodiment and can be variously modified without departing from the subject of the invention.

Figure 10:
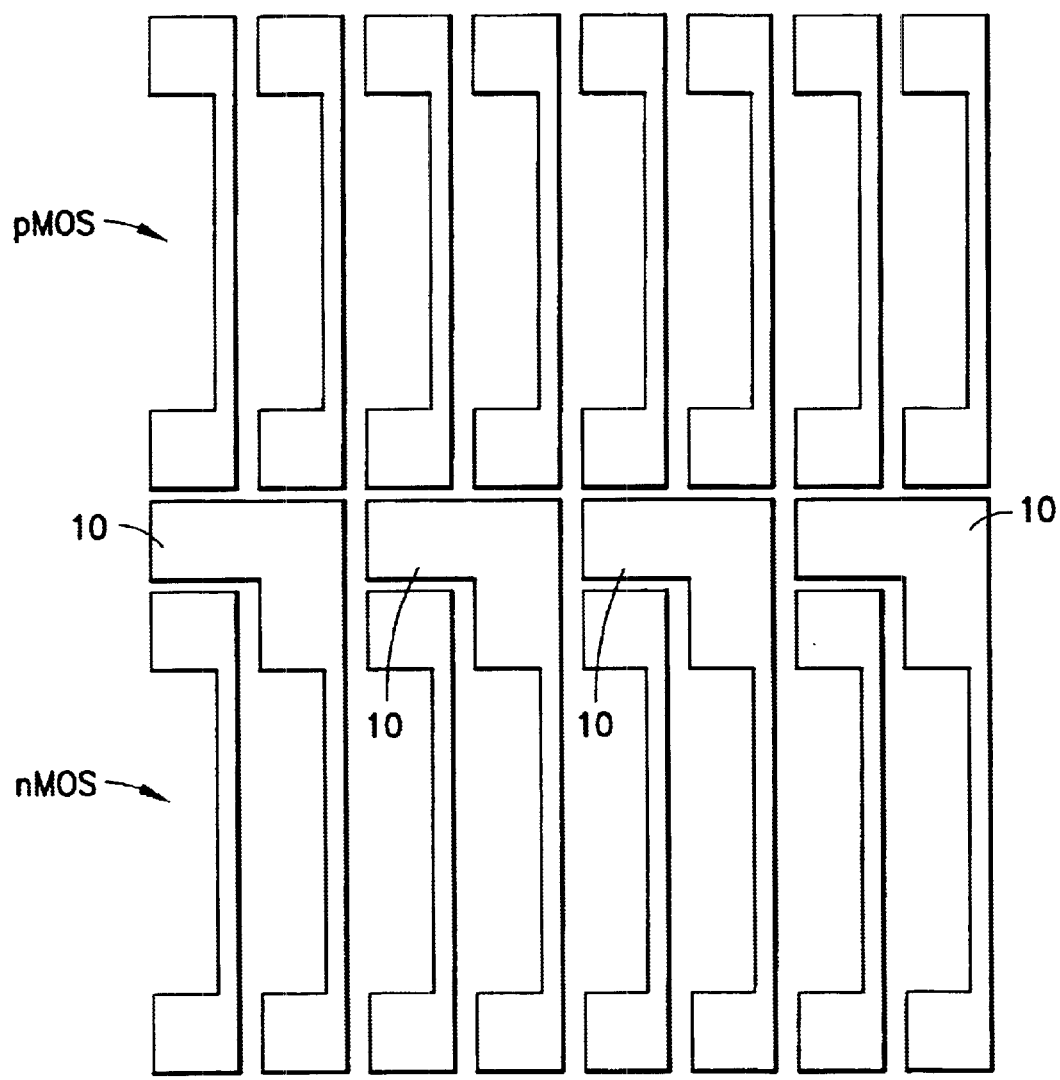
FIG. 10 is a plan view of another example for a part extracted from the gate array of the invention.

For example, while in this embodiment, the connection region 10 is shown as a part of the gate line constituting the p-type MISFET, as is shown in FIG. 10, the connection region 10 may be used as a part of the gate line of the n-type MISFET.

Figure 11:
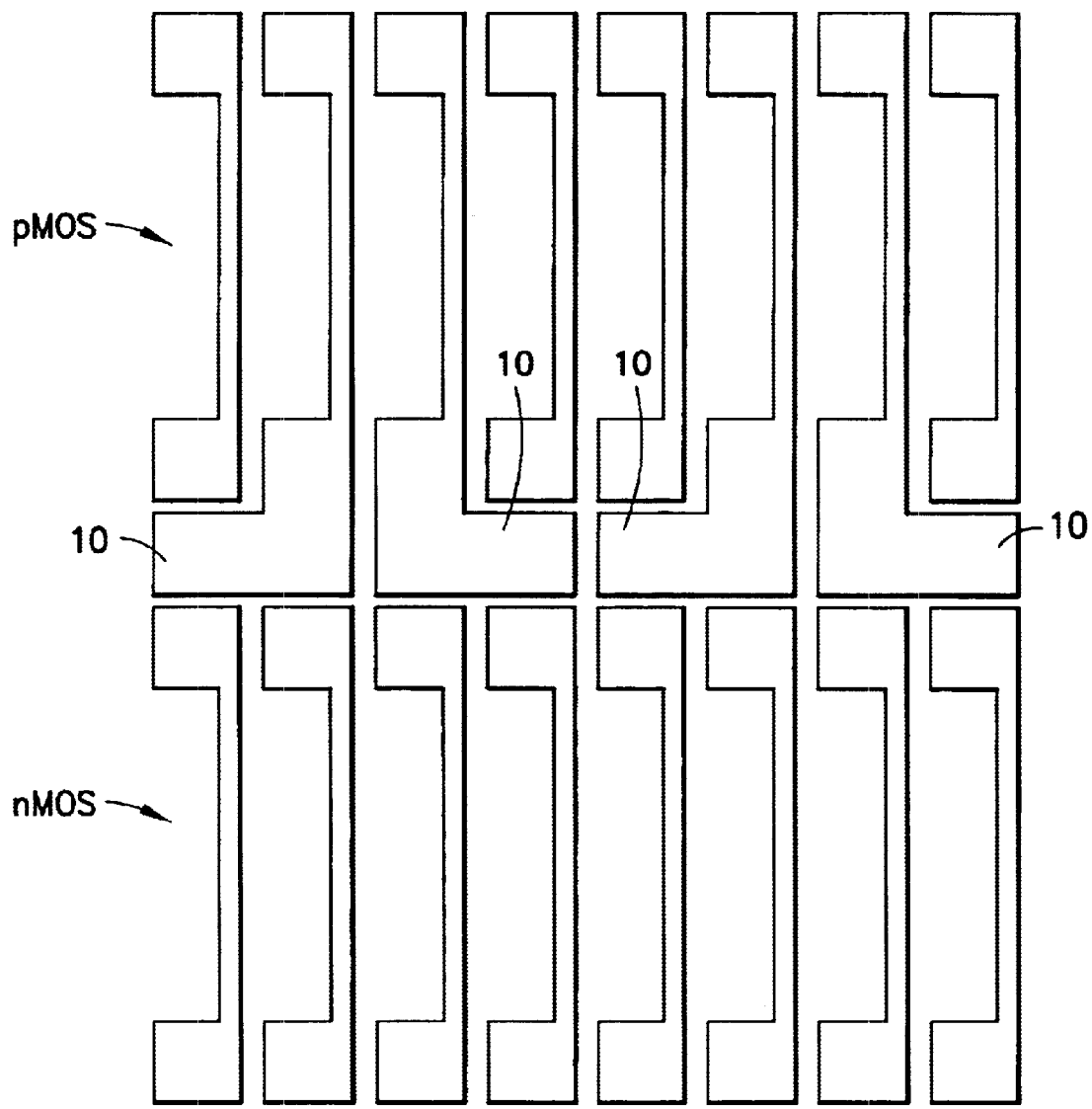
FIG. 11 is a plan view of an additional example of a part extracted from the gate array of the invention.

Furthermore, in this embodiment, the extended portions of the connection region 10 face the same direction. However, as is shown in FIG. 11, the extended portions may alternately face in the opposite direction.

Figure 12B:
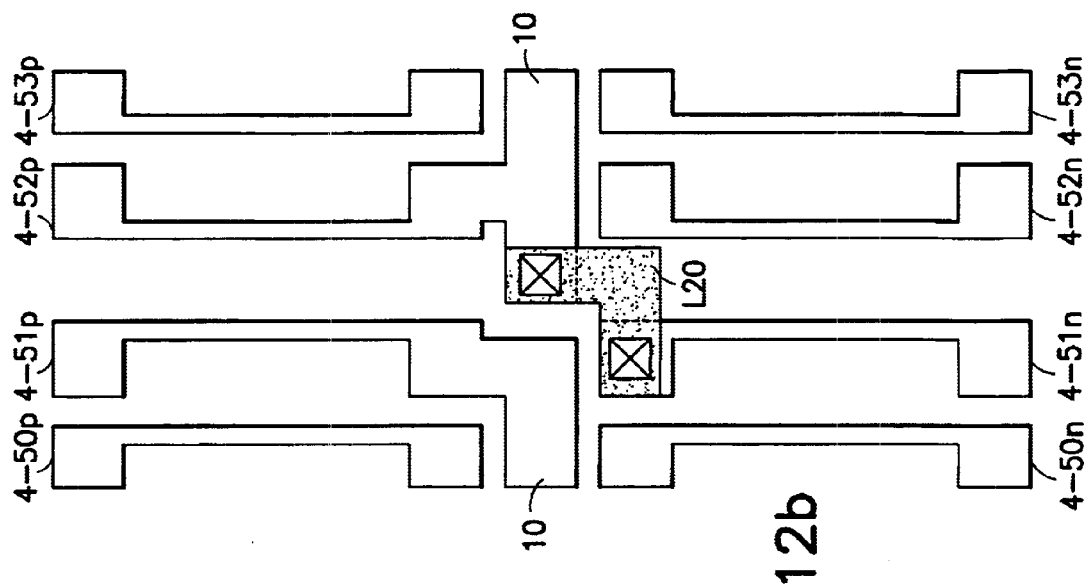
FIGS. 12A and 12B are plan views of a further example of a part extracted from the gate array of the invention.
Figure 12A:
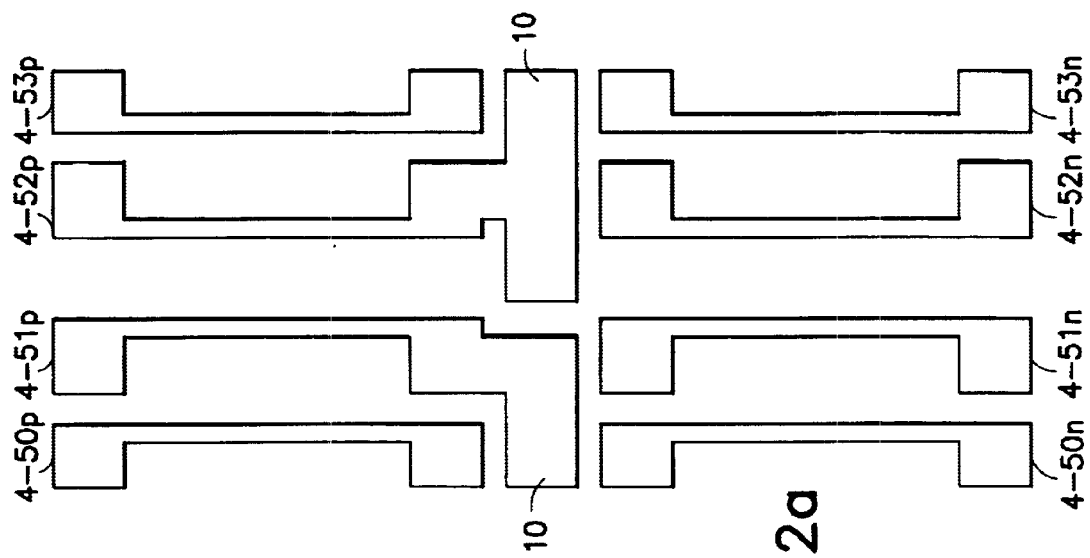

Further, as is shown in FIG. 12A, not only the gate line 4-51p, having the same connection region 10 as in the embodiment, may be provided, but also a gate line 4-52p may be provided that has extended portions of the connection region 10 that face in both positive and negative directions along the x axis (first direction). In this case, as is shown in FIG. 12B, not only the gate line 4-51n and the gate line 4-50p, which are diagonally positioned, can be easily connected, but also the line (L20) can be easily arranged between the gate line 4-51p and the gate line 4-52p, which is symmetrically located relative to the position of the gate line 4-50p. Thus, the degree of freedom for intricate line connections can be increased, and the area that is occupied by the first layer line can be reduced. As a result, the elements can more effectively be utilized in order to contribute to high integration and to a reduction in manufacturing costs.

In this embodiment, gatewidths equivalent to three wiring grids have been obtained for the p-type MISFET and n-type MISFET. However, while taking into account the mobility of the p-type MISFET, the layout of MISFETs may be designed by using a gate width equivalent to four wiring grids for the p-type MISFET and a gate width equivalent to two wiring grids for the n-type MISFET. In this case, since a size equivalent to eleven wiring grids is obtained as the total space required for the wiring, the wiring design is not limited.

The typical effects obtained by the invention are as follows. To connect the gate lines of the devices (MISFETS) of the gate array that are diagonally positioned, the layout of the first layer lines used for the connection of the gate lines can be easily designed. Further, the number of devices required to increase the wiring efficiency of the gate array and to implement the same function can be reduced, and the manufacturing costs for the ASIC can be lowered.

We claim:

1. A semiconductor integrated circuit comprising:

a semiconductor substrate;

at least one n-type region formed in said semiconductor substrate;

at least one p-type region formed in said semiconductor substrate;

an element separation region disposed in said semiconductor substrate between one of said n-type regions and one of said at least one p-type region;

a set of p-type transistors arranged in said n-type region adjacently in a first direction, said set of p-type transistors having gates oriented along a second direction perpendicular to said first direction;

a set of n-type transistors adjacently arranged in said p-type region in said first direction, each of said n-type transistors having a gate oriented along said second direction; and a set of contacts formed on said element separation region, each of said contacts being connected to one of the gate of a p-type transistor and the gate of an n-type transistor, wherein said set of contacts includes a set of extended contacts, each of said extended contacts extending along said second direction and thence along said first direction so that a given extended contact connected to a given transistor has a portion disposed between (1) a first contact connected to a transistor adjacent to said given transistor and the like polarity and (2) a second contact connected to a transistor of opposite polarity, said portion, said first contact and said second contact being collinear with respect to the second direction.

2. A semiconductor integrated circuit according to claim 1, wherein a connection member in a first level of interconnect extending along said second direction connects said portion of an extended contact to one of a first set of transistors to a gate of a transistor of opposite polarity.

3. The semiconductor integrated circuit according to claim 1 wherein said set of contacts is formed so that said extended contacts are connected only to said set of p-type transistors.

* * * * *